United States Patent [19]
Asada et al.

[11] 4,397,510
[45] Aug. 9, 1983

[54] CAPSULE CONNECTOR

[76] Inventors: Takafumi Asada, 22-6, Matsugaoka-cho; Kazuyoshi Shinohara, 36-4, Yamadaike Higashi-cho, both of Hirakata-shi, Osaka, Japan, 573

[21] Appl. No.: 281,666

[22] Filed: Jul. 9, 1981

[51] Int. Cl.³ .......................................... H01R 23/72
[52] U.S. Cl. ......................... 339/17 CF; 339/75 MP; 339/176 MP
[58] Field of Search .......... 339/17 CF, 75 M, 75 MP, 339/91 R, 59 M, 61 M, 176 M, 176 MP; 174/152 FP

[56] References Cited

U.S. PATENT DOCUMENTS

| 3,951,495 | 4/1976 | Donaher et al. | 339/17 CF |
| 4,003,621 | 1/1977 | Lamp | 339/59 M |
| 4,201,435 | 5/1980 | Nakamura et al. | 339/59 M |
| 4,204,722 | 5/1980 | Yasui et al. | 339/75 MP |
| 4,330,165 | 5/1982 | Sado | 339/59 M |

FOREIGN PATENT DOCUMENTS

| 2230337 | 1/1973 | Fed. Rep. of Germany | 339/17 CF |
| 1454612 | 11/1976 | United Kingdom | 339/17 CF |

Primary Examiner—John McQuade
Attorney, Agent, or Firm—Burgess, Ryan and Wayne

[57] ABSTRACT

A capsule connector has a receptacle with a space for removably receiving a capsule therein; that is, a semiconductor device adapted to be externally connected to an electronic device. Multi-contact connectors are disposed at the bottom of the space of the receptacle so as to establish an electrical connection between the capsule and the electronic device; that is, electrical connections between terminal contacts of the capsule and terminal contacts disposed on a base member upon which is mounted the receptacle. A projection is extended from one side of the receptacle so as to engage with one side of the capsule and a sliding pawl is disposed at the opposite side of the receptacle so as to releasably engage with the opposite side of the capsule.

1 Claim, 10 Drawing Figures

CAPSULE CONNECTOR

BACKGROUND OF THE INVENTION

The present invention relates to a connector especially adapted to externally connect a semiconductor device (which will be referred to as a "capsule" in this specification) to an electronic device.

Recently there have become available various types of capsules which are adapted to be externally connected to a desk-top computer so that various complex statistic or scientific calculations may be carried out. There are also available capsules adapted to be externally connected to a pocket-size, electronic translator so that translations among various languages such as English, German and French may be possible.

The prior art capsule connector has the defect that if a capsule has a large number of contacts, a considerably greater force is needed to mount or remove the capsule. In addition, for the mounting or removal of a capsule, a knob or the like must be provided. As a result, the overall thickness of the electronic device is increased.

SUMMARY OF THE INVENTION

In view of the above, one of the objects of the present invention is to provide a capsule connector which offers the very simple connection to or disconnection from an electronic device of capsule and with which the electronic device can be made thin in size.

According to the present invention, a capsule connector has a receptacle with a space for receiving a capsule therein. Multi-contact connectors are disposed at the bottom of the space of the receptacle for establishing the electrical connections between terminal contacts of the capsule and contacts disposed on a base plate upon which is mounted the receptacle. A projection is extended from one side of the receptacle for engagement with one side of the capsule while a sliding pawl is disposed at the opposite side of the receptacle for engagement with the opposite side of the capsule.

DETAILED DESCRIPTION OF THE PRIOR ART

Figure 1:
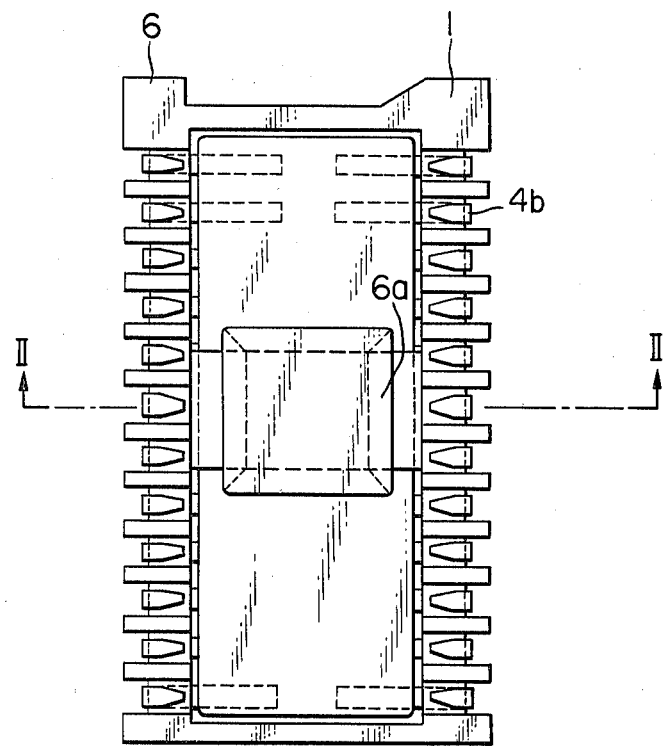
FIG. 1 is a top view of a prior art capsule.
Figure 2:
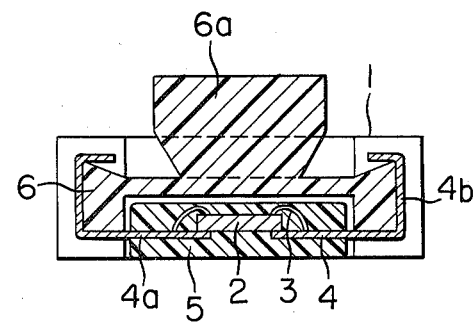
FIG. 2 is a sectional view thereof taken along the line II—II of FIG. 1.
Figure 3:
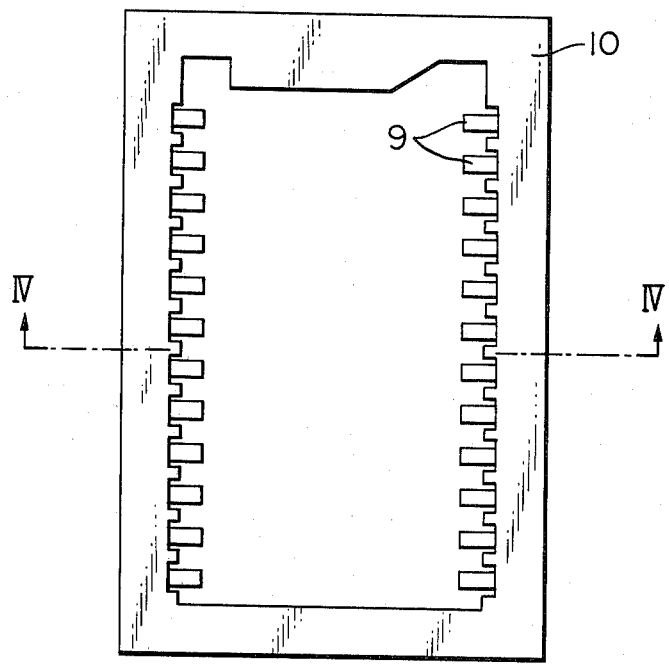
FIG. 3 is a top view of a prior art capsule connector.
Figure 4:
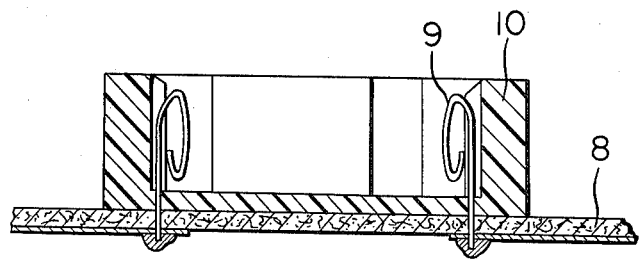
FIG. 4 is a sectional view thereof taken along the line IV—IV of FIG. 3.

Referring to FIGS. 1 through 4, reference numeral 1 denotes a capsule; and 2, an IC device which is electrically connected to terminal contacts 4 and 4a directly or with wires 3. The contacts 4 are made of sheet metal. The IC device 2, the wires 3 and the contacts 4 and 4a are integrally molded with a synthetic resin. The contacts 4 and 4a are bent over the side surfaces of a case 6 and securely clinched thereto.

In order to connect the capsule 1 to an electronic device, it is fitted into a socket 10 mounted on a printed-circuit board 8 of the electronic device, so that the terminal contacts 4 and 4a are connected at their sides 4b to contacts 9 of the socket 10.

However, if the socket 10 has more than twenty contacts 9, a considerably greater force is needed to mount the capsule 1 into the socket 10 or to remove the former from the latter. In addition, the mounting or removal of the capsule 1 is very difficult. In order to remove the capsule 1 from the socket 10, a knob 6a must be provided. As a result, the electronic device becomes thick.

DESCRIPTION OF THE PREFERRED EMBODIMENT

The present invention was made to solve the above and other problems encountered in the prior art capsule connector. Referring to FIGS. 5 through 10, reference numeral 18 denotes a printed-circuit board which is a part of an electronic device. Multi-contact connectors 19 and 19' which are in inverted T-shape in cross section are mounted on the printed-circuit board 18. Reference numeral 18a and 18a' denote printed circuits. Reference numeral 20 denotes a block for positioning the capsule 1. The block 20 which is formed by molding a synthetic resin has two parallel elongated slots 22 and 22' formed through its bottom. The block 20 is mounted on the printed-circuit board 18 in such a way that the ridge portions 19a and 19a' of the connectors 19 and 19' are extended through and beyond the elongated slots 22 and 22' of the block 20 and screws 21 and 21' are tightened in such a way that the block 20 compresses the flange portions 19b and 19b' of the connectors 19 and 19'.

Figure 6:
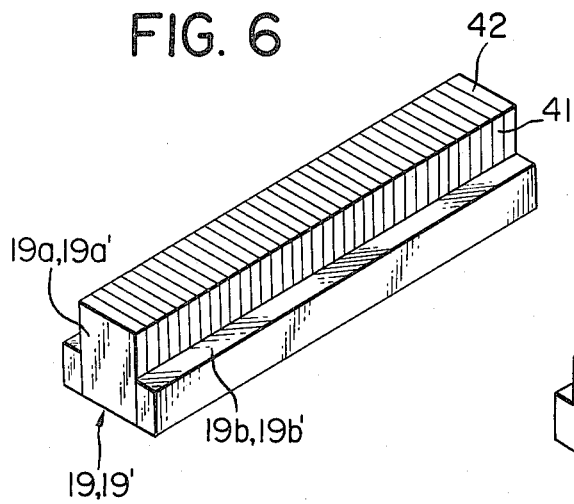
FIGS. 6 and 7 show multi-contact connectors used in the present invention.
Figure 7:
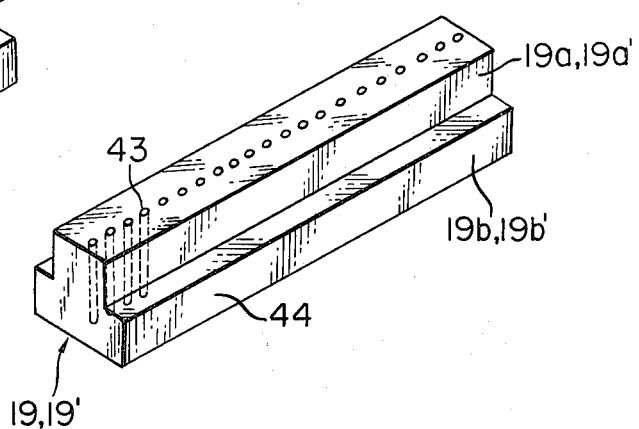

As best shown in FIG. 6 or 7, the multi-contact connectors 19 or 19' may comprise a lamination of electrically insulating members 41 and electrically conductive members 42 both of which are made of resilient materials. Alternatively, it may comprise a main body which is made of an electrically insulating and resilient material and a plurality of resilient lead wires 43 extended vertically through the main body 44 and spaced apart from each other by a suitable distance. With either of the connectors as shown in FIG. 6 or 7, highly reliable electrical connections are ensured between the capsule 1 and the connectors 19 and 19' because the latter have sufficient resiliency. Especially with the connectors as shown in FIG. 7, even when the capsule 1 and the multi-contact connectors 19 and 19' are contaminated with dust, oil or the like, highly reliable electrical connections are ensured because the lead wires 43 are extended through such contaminants.

Figure 8:
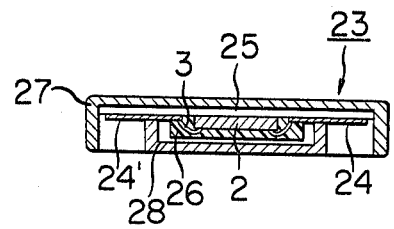
FIG. 8 is a cross sectional view of a capsule in accordance with the present invention.

As shown in FIG. 8, a capsule 23 has an IC device 2 mounted on a base number 25 and electrically connected to contacts 24 and 24' with wires 3. A synthetic resin 26 is molded around the IC device 2 so as to protect it. The IC device 2 and the base member 25 constitute an IC unit which is encapsulated between an upper case 27 and a lower case 28.

Figure 9:
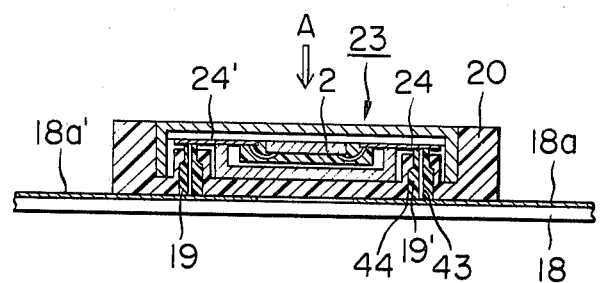
FIG. 9 is a sectional view taken along the line IX—IX of FIG. 5.

The capsule 23 is fitted into the block 20 in the direction indicated by an arrow A in FIG. 9. The contacts 24 and 24' of the capsule 23 are electrically connected to pattern elements 18a of the printed-circuit board 18 through the lead wires 43 of the multi-contact connectors 19 and 19'.

Figure 5:
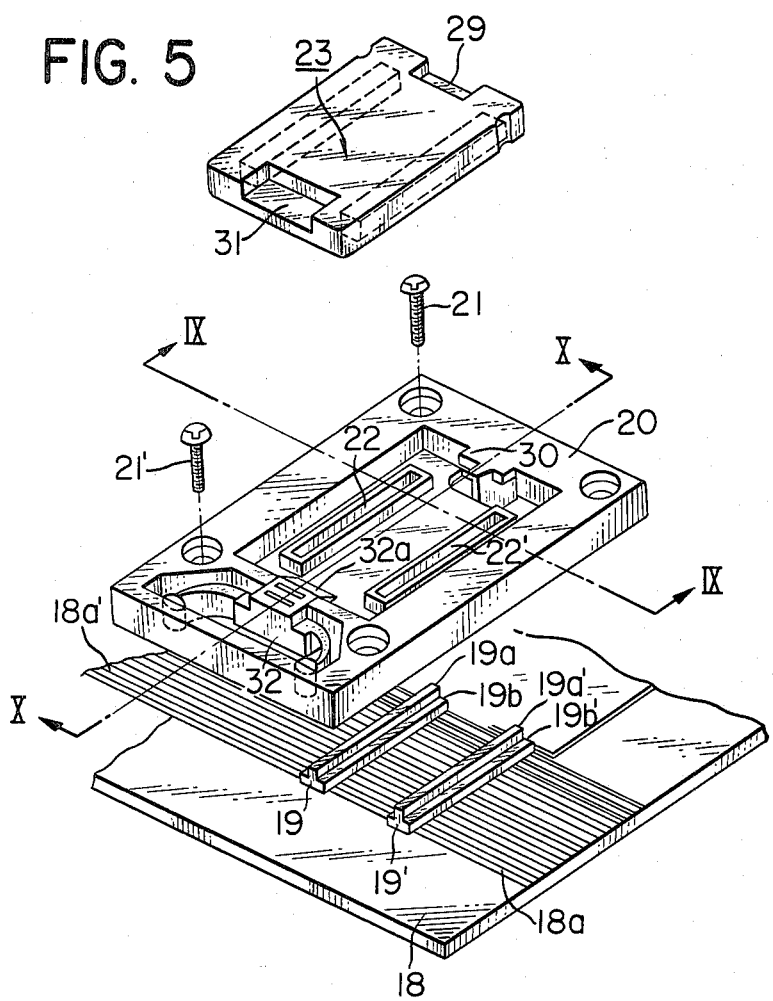
FIG. 5 is a perspective view of a preferred embodiment of the present invention.

As shown in FIG. 5, when the capsule 23 is fitted into the block 20, a first recess 29 of the capsule 23 engages with a tenon 30 which serves as a pivotal point as will be described below and a second recess 31 of the capsule 23 engages with a pawl 32a of a sliding member 32 which is slidably mounted on the block 20. As a consequence, the capsule 23 is securely held in position in the block 20.

Figure 10:
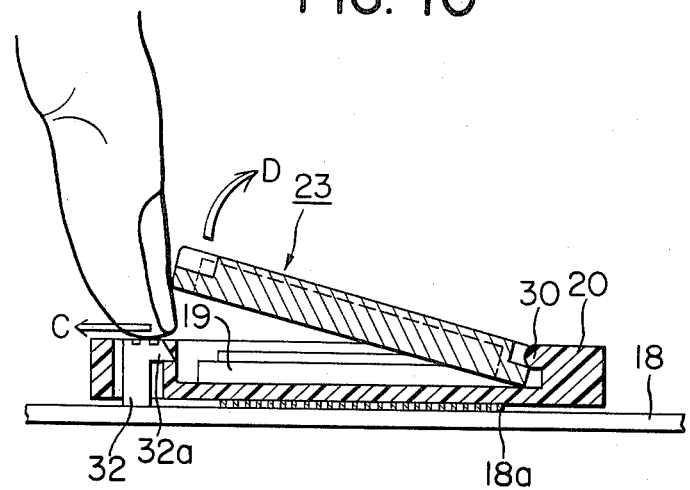
FIG. 10 is a sectional view taken along the line X—X of FIG. 5.

As shown in FIG. 10, in order to remove the capsule 23 from the block 20, one pushes the sliding member 32 in the direction indicated by an arrow C so as to disengage the pawl 32a from the second recess 31 of the capsule 23. Then, because of the resiliency of the multi-contact connectors 19 and 19' or the force of a leaf spring or the like (not shown), the capsule 23 is forced to swing about the tenon 30 in the direction indicated by an arrow D through such an angle that one may readily pick up the side of the capsule 23 opposite to the tenon 30. Thus, the mounting or removal becomes very simple. In addition, the knob 6c (See FIG. 2) can be eliminated, so that the electronic device can be made thin in size.

The block 20 may be molded integral with a cabinet or the like of the electronic device and the sliding member 32 may be molded integral with the block 20. Then, the number of components may be reduced.

In summary, according to the present invention, the mounting or removal of the capsule can be made only with one finger in a very simple manner. In addition, the capsule connector is highly reliable in operation and is easy to fabricate. Furthermore, the electronic device can be made thin.

What is claimed is:

1. A capsule connector characterized in that multi-contact connectors for establishing electrical connections between contacts of a capsule on the one hand and contacts on a base member on the other hand are disposed at the bottom of a receptacle having a space for receiving said capsule therein so as to hold said capsule in a predetermined position, said receptacle being mounted on said base member;

a projection is extended from one side of said receptacle so as to engage with one side of said capsule;

a sliding pawl is disposed at the other side of said receptacle;

a spring means is so disposed that a resilient force acts between said capsule and said receptacle;

said sliding pawl is slidable into said space of said receptacle and has such a shape that it retains said capsule in position against said resilient force generated by said spring means;

each of said multi-contact connectors comprises a main body which is made of an electrically insulating and resilient material and is in an inverted T-shape in cross section and a plurality of electrically conductive and resilient members such as lead wires extended through said main body so that said multi-contact connectors serve as said spring means;

elongated slots are formed through the bottom of said space of said receptacle; and said receptacle is mounted on said base member in such a way that the ridge portions of said multi-contact connectors are extended through and beyond said elongated slots and the undersurface portions surrounding said elongated slots of said receptacle press the flange portions of said multi-contact connectors against said base member.

* * * * *